United States Patent [19]

Lovelace

[11] Patent Number: 5,382,786
[45] Date of Patent: Jan. 17, 1995

[54] INTEGRATED PHOTODETECTOR WITH MOVING DESTINATION CIRCUIT

[75] Inventor: Ralph E. Lovelace, Los Gatos, Calif.

[73] Assignee: Hewlett-Packard Company, Palo Alto, Calif.

[21] Appl. No.: 43,661

[22] Filed: Apr. 6, 1993

[51] Int. Cl.⁶ ............................................. H01J 40/14
[52] U.S. Cl. .................................. 250/214 A; 330/308
[58] Field of Search ............. 250/214 A, 214 LA, 551; 330/308, 59, 110; 307/311, 491

[56] References Cited

U.S. PATENT DOCUMENTS

| | | | |
|---|---|---|---|
| 4,567,446 | 1/1986 | Konishi | 250/214 A |
| 4,861,978 | 8/1989 | Anderson | 250/214 A |
| 5,061,859 | 10/1991 | Lovelace et al. | 250/551 |
| 5,216,386 | 6/1993 | Wyatt | 330/308 |

Primary Examiner—David C. Nelms
Assistant Examiner—Que T. Le

[57] ABSTRACT

A photodetector circuit provides a highly accurate digital signal output in response to incoming optical pulses from an LED having an inherent optical output fall time. The LED is optically coupled to a photodiode which produces an input current in response to the optical output. The input current is amplified by an amplifier having two stages to produce an output voltage signal for switching an output transistor. An RC circuit is coupled between the first and second stage amplifiers for introducing a transient into the output voltage signal for reducing propagation delay and increasing the noise margin of the circuit.

12 Claims, 3 Drawing Sheets

OUTPUT VOLTAGE WAVEFORM ~
SECOND STAGE AMPLIFIER

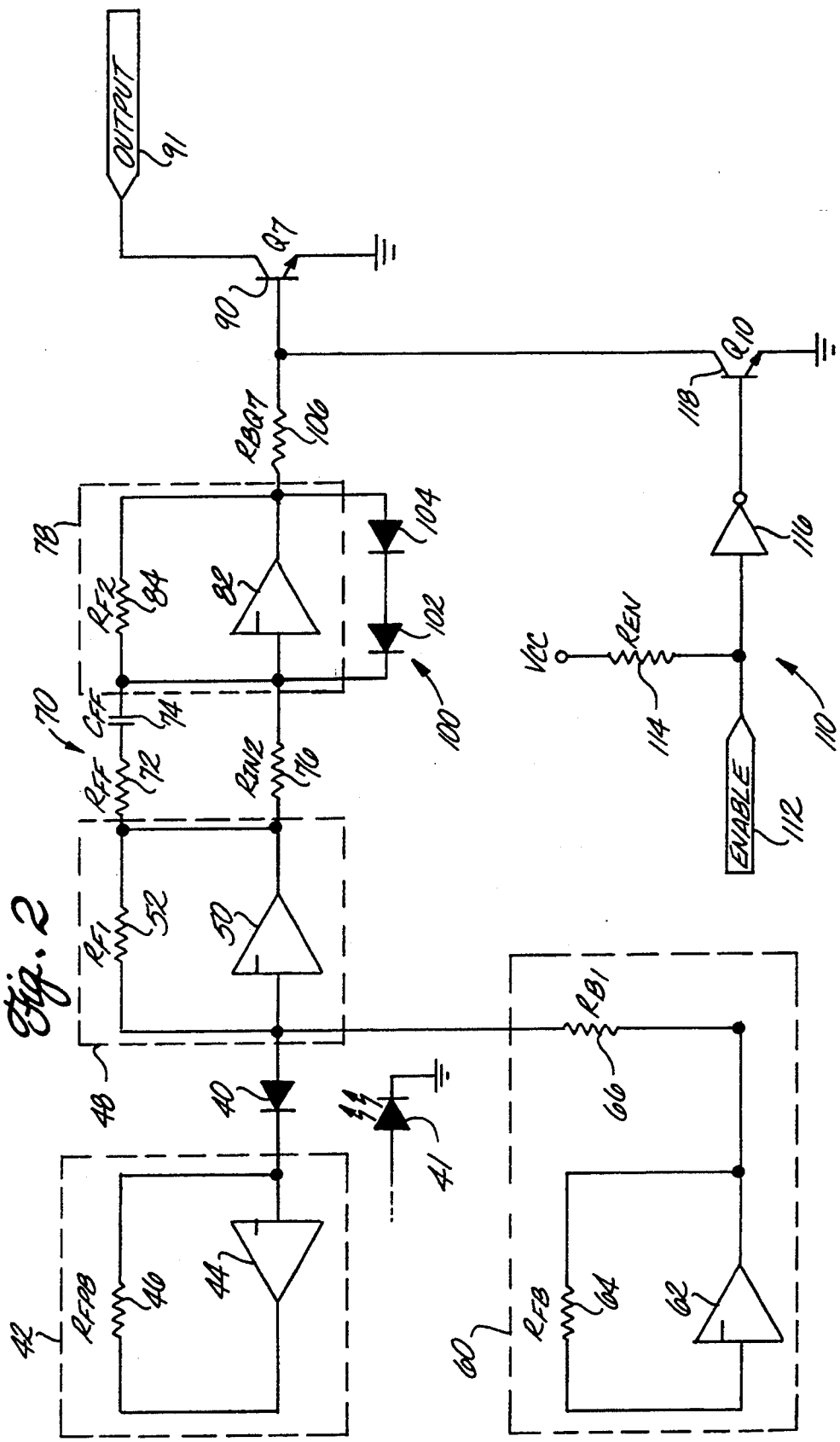

INTEGRATED PHOTODETECTOR WITH MOVING DESTINATION CIRCUIT

FIELD OF THE INVENTION

This invention relates to photodetector/amplifier circuits and, more particularly, to an integrated photodetector circuit with minimum propagation delay and noise rejection.

BACKGROUND OF THE INVENTION

An optical isolator (sometimes referred to as an optocoupler) provides isolation between a digital input circuit and a digital output circuit. A typical optical isolator has a light-emitting diode (LED) electronically coupled to the input circuit. The LED is optically coupled across an electronically isolating gap to a photodetector device, such as a photodiode. The photodiode receives an optical signal from the LED and converts the signal to an electric current pulse. Typically, this current pulse is amplified in a switching circuit coupled to the photodiode and delivered as a digital output signal to the output circuit.

It has been observed in systems with optocouplers that there are times when apparently random signal errors arise. Such "glitches" are not found in all systems, nor do they occur with sufficient regularity that their source can be readily identified. In fact, workers have for many years sought to improve the reliability of digital data and eliminate such random errors.

It is, therefore, desirable to provide an integrated photodetector for an optical isolator having improved reliability at high speeds over a broad range of LED speeds and despite power supply noise.

SUMMARY OF THE INVENTION

The present invention provides an integrated photodetector circuit including a photodiode for generating an input current pulse in response to light. The input current from the photodiode is transferred to a first stage amplifier coupled to the photodiode for converting the input current pulse to a voltage signal having an initial value and a final value. The first stage amplifier is coupled to a second stage amplifier. A moving destination circuit is coupled between the first and second amplifiers for temporarily shifting the final value of the voltage signal to a changing destination value provided by a transient signal having a dominant time constant. The moving destination circuit is connected to an output transistor which produces a digital output signal when the output voltage of the second stage amplifier crosses the threshold voltage of the output transistor.

By temporarily shifting the final value of the signal, the signal will cross the switching threshold of the output transistor during a rapidly changing portion of the exponential voltage signal response. Without the moving destination circuit, the turn-off propagation

BRIEF DESCRIPTION OF THE DRAWINGS

These and other features of the present invention will be better understood with reference to the following detailed description when considered in connection with the accompanying drawing wherein:

FIG. 2 is a circuit representation of an integrated photodetector circuit according to the present invention;

DETAILED DESCRIPTION

Figure 1:
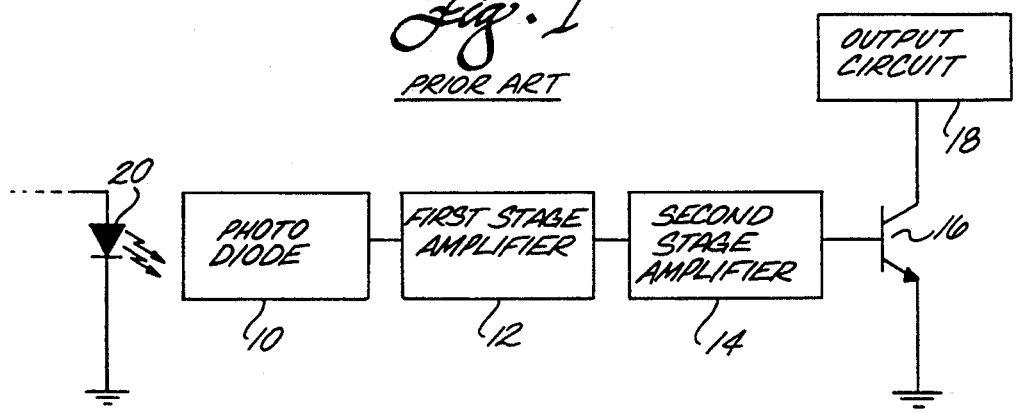
FIG. 1 is a generalized block representation of a prior art two-stage linear detector/amplifier circuit.

Referring to FIG. 1, a typical prior art two-stage linear detector/amplifier switching circuit generally includes a photodiode 10, first and second amplifier stages 12, 14, and an output transistor 16 coupled to an output circuit 18. The photodiode receives optical signals from a light emitting diode (LED) 20 optically coupled to the photodiode, and converts the optical signals to current pulses which are input to the first stage amplifier.

In operation, the first stage amplifier, typically an inverting operational amplifier (op-amp) circuit, converts a current pulse caused by an increasing optical output signal to a negative going voltage signal. The signal is then passed to the second stage amplifier, typically also an inverting op-amp circuit, to produce a positive going voltage signal which is applied to the base of the output transistor. The output transistor switches on when its base voltage crosses its threshold voltage. In an exemplary embodiment, this causes the output transistor to pass a low digital signal from its collector to the output circuit until the transistor is switched off.

As the LED turns off, the photodiode current pulse diminishes proportionally to the fall of optical output from the LED. As the signal propagates to the second stage amplifier, the output of the second-stage amplifier trends negative. When the output voltage of the second-stage amplifier falls below the threshold voltage of the output transistor, the transistor switches off, and the digital signal from the output transistor to the output circuit goes high.

It has been found that one of the critical limitations of optical isolators is the accuracy of switching at high speeds, particularly the switching "OFF" when LED output decreases. Switching accuracy may be impaired in a number of ways, including slow LED turn-off and large input signals which cause a long turn-off propagation delay in the switching circuit. Accuracy may also be affected by power supply noise or a slow LED time constant which could cause anomalies in the digital output.

In some cases, the output of the second-stage amplifier may again cross the threshold and erroneously turn the output transistor on, even though the light output from the LED has fallen to a point that the transistor should be off. This erroneous output may be caused in a variety of ways, including ringing in the output of the first stage amplifier and long optical fall time of the LED.

Ringing, or unintentional self-oscillation, can be caused by overshoot in the output of the first-stage amplifier in response to the LED optical output. As the LED is turned off, the first-stage amplifier returns to its quiescent state with the output transistor off. The overshoot in the response helps to turn off the output transistor rapidly. However, the second half-cycle of the ringing may cause the output transistor to turn back on, resulting in erroneous digital signal output.

Another cause of erroneous output could be long optical fall time of an LED so that the output voltage does not fall below the threshold quickly enough. The optical fall time of certain LEDs consists of a waveform having two time constants. In an exemplary two time constant LED, the initial part of the waveform from full optical output to approximately 20% of full output is characterized by a relatively short time constant. The second part of the waveform, or "slow tail" of the waveform, is characterized by a much longer time constant. The slow tail significantly increases propagation delay, especially with large input signals. If, for example, the threshold voltage of the output transistor is 10% of the amplitude of the input signal, the slow tail will significantly delay switching until the signal falls to 10% of its amplitude.

The slow tail also significantly reduces the noise margin of the switching circuit for a relatively long period. Because of the reduced noise margin during the slow tail, power supply noise or other noise may cause the voltage at the base of the output transistor to rise above the switching threshold, resulting in erroneous digital output to the output circuit.

Referring to FIG. 2, an integrated photodetector circuit according to the present invention prevents some of the anomalies found in typical prior art linear detector/amplifiers. The integrated photodetector circuit includes a photodiode 40 for converting incoming optical signals from an LED 41 to electric current pulses. The anode of the photodiode is coupled to a photodiode bias amplifier 42 comprising a photodiode bias op-amp 44 and a photodiode bias negative feedback resistor (RFPB) 46. The photodiode bias amplifier provides a well-regulated bias for the cathode of the photodiode which prevents power supply variations from coupling into the input through the photodiode. The photodiode is preferably biased at zero volts across it to eliminate leakage currents.

The anode of the photodiode is coupled to a conventional first-stage amplifier 48 which includes a an inverting op-amp 50 and a first stage feedback resistor (RF1) 52. As current pulses from the photodiode are delivered to the first-stage amplifier, the amplifier produces a negative voltage at its output equal to the photodiode current multiplied by the value of RF1.

The first-stage amplifier is biased by a first stage bias amplifier 60 comprising a negative feedback bias op-amp 62, a bias feedback resistor (RFB) 64, and a first-stage bias resistor (RB1) 66. The bias op-amp is preferably matched with the op-amp of the first-stage amplifier. The first-stage bias amplifier supplies a predictable bias current to the first-stage amplifier for cancelling shift in the output of the first-stage amplifier due to base current.

The first-stage amplifier is coupled to an RC circuit, also called a moving destination circuit 70, comprising a gain boosting resistor (RFF) 72 and a capacitor (CFF) 74. The moving destination circuit is coupled to a second-stage input resistor (RIN2) 76, and a conventional second-stage amplifier 78. The gain boosting resistor RFF is connected in series with the capacitor CFF to form the RC circuit. The RC circuit is connected in parallel with the second-stage input resistor RIN2.

The second-stage amplifier includes a negative feedback op-amp 82 and a second stage feedback resistor (RF2) 84, and is preferably substantially similar to the first-stage amplifier. The second-stage amplifier provides a positive voltage signal in response to a negative signal from the first-stage amplifier for switching the output transistor (Q7) 90. When Q7 is switched on, it provides a digital output signal to an output circuit 91 until Q7 is switched off.

The moving destination circuit provides a "capacitive peaked" drive current to the base of Q7 which eliminates the need for overshoot in the output waveform of the first-stage amplifier to achieve short propagation delays. In this case, a moving destination circuit comprises a circuit connected to the input of an amplifier which introduces a transient in the amplified output signal when the output signal trends toward its quiescent state of zero. The turn-off propagation delay is considerably improved by this addition.

Figure 3:
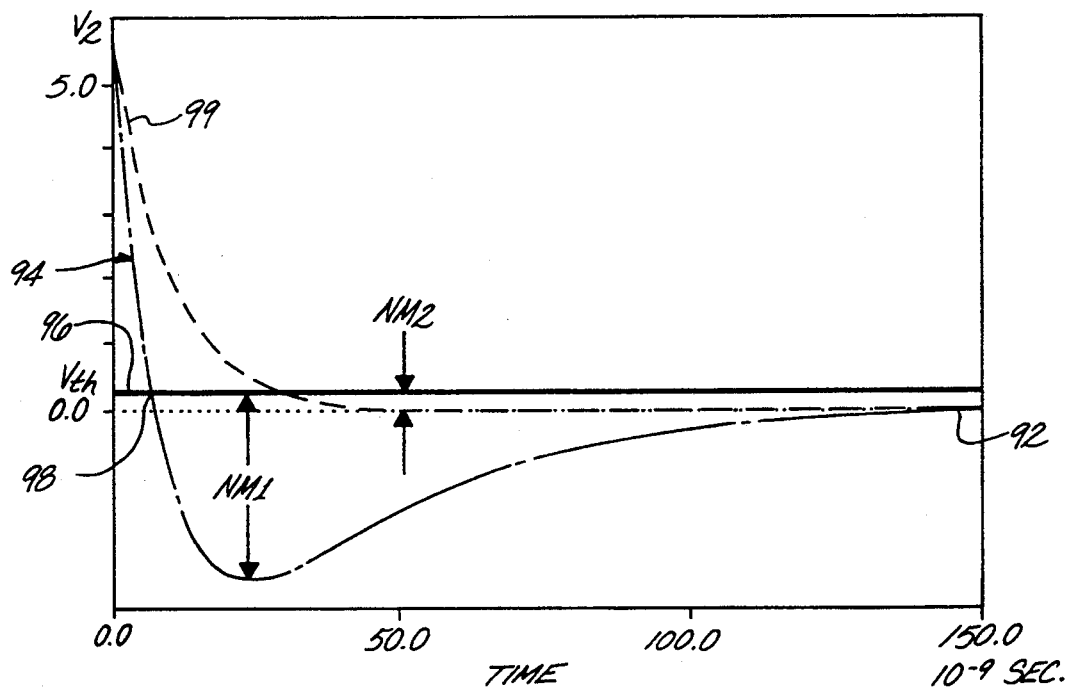
FIG. 3 is a graphical representation of exemplary output waveforms of the present invention and a typical prior art circuit.

Referring to FIG. 3, the effect of the moving destination circuit is to temporarily shift the final value 92 of the voltage signal output 94 of the second stage amplifier to a changing destination value, or target value, provided by a transient having the single dominant time constant of the RC circuit. As the capacitor discharges, the destination value approaches the final value, or quiescent state value, of the amplifier output. By shifting the final value of the voltage signal output, the signal crosses the switching threshold 96 of the output circuit during the rapidly occurring initial portion 98 of the exponential response of the voltage signal output waveform. Without the moving destination circuit, the turn-off propagation delay for large input signals and slow LEDs increases drastically. This can be seen with reference to the output waveform 99 of a second-stage amplifier without the moving destination circuit which simply falls to the quiescent state value at a relatively gradual rate.

The improved noise rejection with the RC circuit is also indicated by the curves in FIG. 3. The sources of noise which cause deviation in the ideal waveforms are a slower time constant of the LED for the final portion of the optical output fall time, power supply noise generated by output current coupled to the input through lead inductance, and overshoot and ringing in the first-stage amplifier. In general, the noise margin is a function of time which equals the difference between the voltage v2 at the output of the second-stage amplifier and the threshold voltage vth of the output transistor. As shown in the ideal graph, the noise margin NM1 just after switching for the circuit of the present invention is much greater than the corresponding noise margin NM2 for the prior art circuit. It is important for the noise margin to be large just after switching because interference signals from switching transients typically occur at that time. If the noise on v2 exceeds the voltage vth for a long enough period, erroneous output will occur at the output of the transistor Q7. With the RFF and CFF added, the noise margin increases to a very large value and gradually decays to the same value as it would be without RFF and CFF.

The capacitance of CFF and the resistance of RFF are preferably chosen to produce a time constant which appropriately changes the output voltage waveform. If the time constant is too short, the beneficial effects of increased noise margin will not be realized. Conversely, if the constant is too long, the negative going transient could remain negative too long, detrimentally affecting the time it takes to switch the output transistor back on.

Referring again to FIG. 2, to prevent large supply current from flowing at the output of the second-stage amplifier due to very large values of input current from the photodiode, a clamping circuit 100 is coupled to the second-stage amplifier. The clamping circuit includes a pair of diodes (D1, D2) 102, 104 coupled across the second-stage op-amp.

The output of the second-stage amplifier is coupled to an output transistor bias resistor (RBQ7) 106 coupled to the base of the output transistor Q7 and to an enabling circuit 110. The enabling circuit comprises an enable input 112, an enabling resistor (REN) 114 coupled to a voltage source VCC and a logic inverter 116, and a transistor (Q10) 118, the base of which is coupled to the output of the logic inverter. The emitter of Q10 is connected to ground. The collector of Q10 is coupled between a resistor (RBQ7) 120 and the base of the output transistor Q7. The enable circuit allows disabling and turning on the output transistor Q7 for general purpose logic.

In operation, if the input to the enable circuit is low, the digital output signal is always high, independent of the photodiode operation. If the input to the enable circuit is high, the inverting amplifier delivers a low signal to the base of Q10, turning it off and enabling output based on the input from the photodiode.

The circuit components of the integrated photodetector can be tailored to meet specifications for particular LEDs or output circuits. For example, the output of the second-stage amplifier necessary to barely switch Q7 can be set by altering the relative emitter areas of the first-stage and second-stage amplifiers, the switching transistor (Q7) and the ratio RIN2/RF2. The gain of the circuit from the photodiode input to the second-stage amplifier is adjusted by RF1. The gain of the second stage amplifier is adjusted by increasing or decreasing the resistance of RF2 or RIN2.

One constraint on the values of the resistors that can be chosen is that input current compensation must be achieved if the input currents to the first and second amplifiers are different. Without compensation, the output of the second-stage amplifier may shift positive by an amount equal to the input current from the photodiode multiplied by RF2. Compensation for this shift can be achieved by shifting the output of the first-stage amplifier negative by an amount equal to the second-stage amplifier input current divided by RF2/RIN2. This is accomplished by an appropriate increase in RB1.

In an exemplary embodiment, RFF and RIN2 each equal 1000 ohms. RF1, RF2, RFB, and RFPB each equal 12 kiloohms; RB2 equals 13 kiloohms; and RBQ7 equals 350 ohms. The capacitance of CFF equals 20 picorarads.

The input to the first-stage amplifier is a 10-microamp current pulse produced at the anode of the photodiode. With RF1 at 12 kiloohms, this input current pulse will produce a negative 120-millivolt pulse at the output of the first-stage amplifier. Capacitor CFF will charge to this value while the current is "on." The output of the second-stage amplifier would be 1.44 volts, or approximately five times the 0.288 volt signal to barely turn on Q7. When the input current is turned off, the output of the first-stage amplifier returns to zero volts. Initially, the voltage across CFF does not change, and RFF is temporarily considered in parallel with RIN2. In an exemplary embodiment with RFF equal to RIN2, the gain of the second-stage amplifier would be approximately twice its DC value. The output response of the second-stage amplifier starts as if it had a final value of −1.44 volts and reaches the 0.288 volts threshold point of Q7 when its output reaches 40% of this final value. Without RFF and CFF, the input of the second-stage amplifier must fall 80% of its final value which would take considerably longer, especially if an LED exhibits an output waveform having a slow tail.

Figure 4:
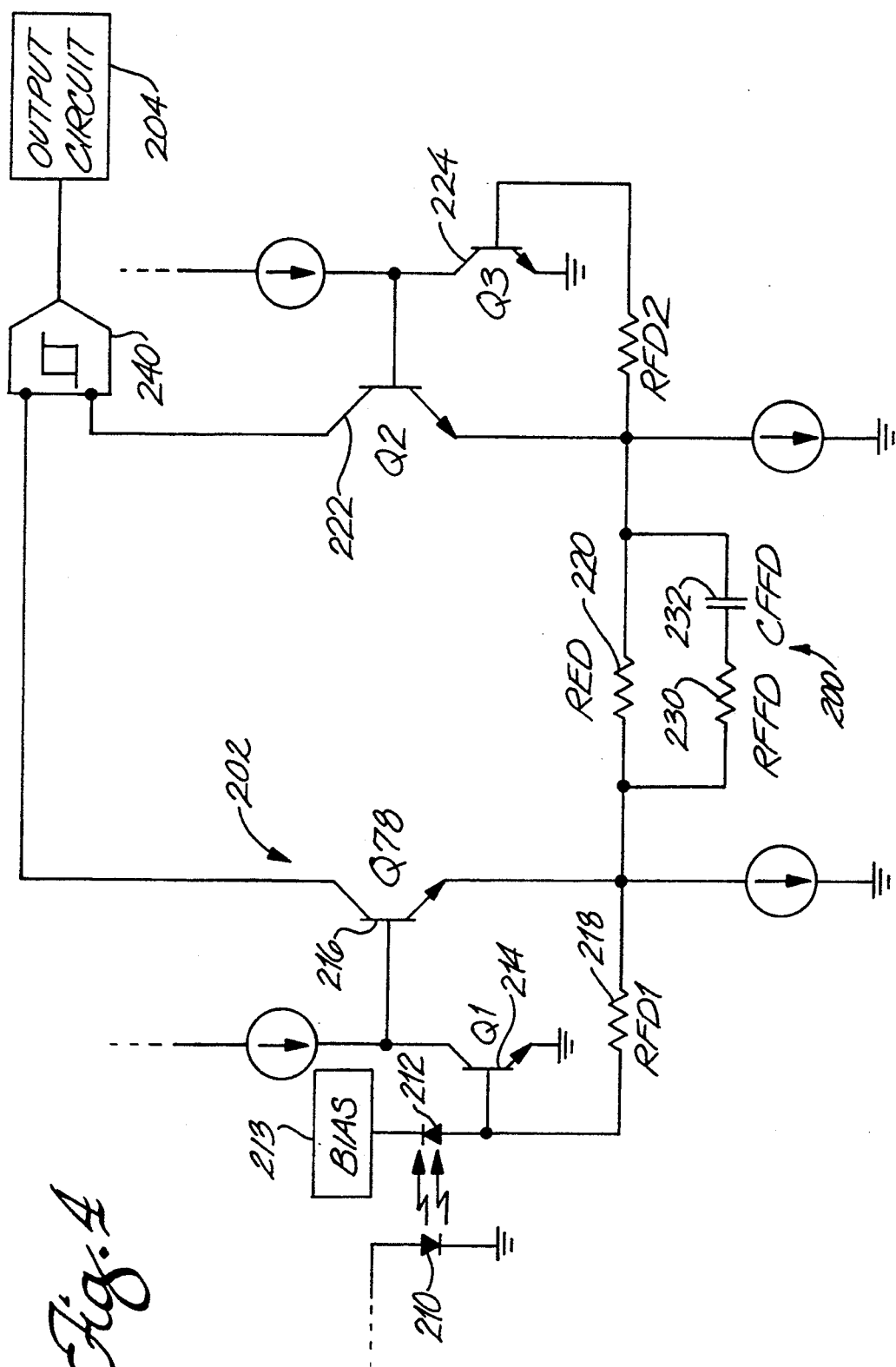
FIG. 4 is a circuit representation of an alternate embodiment of the integrated photodetector circuit according to the present invention.

Referring to FIG. 4, an alternate embodiment of the integrated photodetector circuit according to the present invention includes a moving destination circuit 200 coupled to a differential amplifier switching circuit 202. The alternate embodiment is preferable to the embodiment shown in FIG. 3 in applications involving an output circuit 204 which requires high current digital output signals. The differential amplifier provides superior rejection of high noise amplitude being coupled back through the power supply leads.

In operation, an LED 210 transmits optical signals to a photodiode 212. The photodiode converts the optical signal to an input current for the differential amplifier. The photodiode bias amplifier 213, substantially similar to that of the first embodiment, provides a well-regulated bias which prevents power supply variations from coupling into the input current.

The input current from the photodiode turns a transistor (Q1) 214 on and forces a negative voltage at the emitter of first differential transistor (Q78) 216. A voltage drop occurs across resistor RFD1. This voltage drop causes a decrease in current across a first differential resistor (RFD1) 218 connected in parallel with an emitter resistor (RED) 220, consequently increasing the collector current of the second differential transistor (Q2) 222. The collector current of transistor Q78, caused by the input current pulse, is equal to the negative emitter voltage at the emitter of Q78 divided by RFD1 and in parallel with RED.

The current gain to the collector current of Q78, caused by the change in emitter voltage at Q78, is equal to the input current multiplied by RFD1, divided by the parallel combination of resistors RED and RFD1. The current gain to the collector of Q2 is equal to the input current multiplied by RFD1 and divided by RED. The bias transistor (Q3) 224 provides a balanced bias to transistors Q2 and Q78 so that their emitters are at the same voltage. The base voltages and currents of Q1 and Q3 cancel one another.

For a rapidly moving signal, gain boosting resistor (RFFD) 230 and capacitor (CFFD) 232 provide a moving destination RC circuit 200 for providing capacitive peaking in the output waveform of the difference in collector current between Q78 and Q2. Similar to the first embodiment, the moving destination circuit serves to introduce a transient signal into the output of the amplifier. In the differential amplifier embodiment, the output waveform to the switching circuit is a differential output equal to the difference in the collector currents between Q2 and Q78, instead of a voltage waveform. The transient drives the differential output negative at a rapid rate, thereby decreasing the time it takes for the differential output waveform to cross the switching threshold of the switching circuit 240.

The collectors of Q2 and Q78 are coupled to the switching circuit. The switching circuit provides an output pulse to the output circuit when the differential output signal crosses the threshold of the switching circuit. The conventional switching circuit preferably has hysteresis. The hysteresis results in rapid transition at the output of the threshold circuit and additional noise rejection on the input current.

Many variations and modifications will be apparent to those skilled in the art without departing from the spirit and scope of the invention.

What is claimed is:

1. A photodetector circuit comprising:
   a photodetector for generating an input current pulse in response to light;
   an amplifier coupled to the photodetector for converting the input current pulse to an amplifier output signal that trends from an initial value to a final value; and
   shifting means coupled to the amplifier for temporarily shifting the trend of the amplifier output signal to an intermediate destination value different from the final value of the amplifier output signal.

2. The photodetector circuit of claim 1 wherein the shifting means comprises an RC circuit.

3. The photodetector circuit of claim 2 further comprising a resistor connected in parallel with the RC circuit.

4. A photodetector circuit comprising:
   a photodetector for generating an input current pulse in response to light;
   an amplifier coupled to the photodetector for converting the input current pulse to an amplifier output signal having an initial value and a final value;
   shifting means coupled to the amplifier for temporarily providing a destination value different from the final value of the amplifier output signal; and
   a clamping circuit coupled to the amplifier for preventing large input currents from drawing large currents from a power supply.

5. The photodetector circuit of claim 1 further comprising an output transistor coupled to the amplifier for producing a digital output signal when the amplifier output signal reaches threshold voltage of the output transistor.

6. A photodetector circuit comprising:
   a photodetector for receiving a light signal and providing an input current pulse;
   a first amplifier coupled to the photodetector output for providing a first output signal in response to the input current pulse;
   a second amplifier coupled to the first amplifier for producing a second output signal in response to the first output signal; and
   transient producing means coupled between the first and second amplifiers for introducing a transient in the second output signal when the input current pulse ends.

7. The photodetector circuit of claim 6 wherein the transient producing means comprises an RC circuit.

8. The photodetector circuit of claim 6 wherein the transient producing means comprises a capacitor coupled to the output of the first amplifier and the input of the second amplifier for charging when the input current pulse is on and for discharging to the input of the second amplifier when the input current pulse ends.

9. The photodetector circuit of claim 6 wherein the first and second amplifiers are coupled as differential amplifiers and the transient producing means comprises an RC circuit coupled between the inputs to the first and second amplifiers.

10. The photodetector circuit of claim 6 wherein the transient producing means produces a signal having a time constant greater than the time constant of the first output signal.

11. A photodetector circuit comprising:
    a light emitting diode;
    a photodetector for irradiation by the light emitting diode;
    a first amplifier coupled to the output of the photodetector;
    a second amplifier coupled to the output of the first amplifier; and
    means coupling the first amplifier and the second amplifier for changing the input to the second amplifier with a waveform having a time constant greater than the fall time of the light emitting diode.

12. A photodetector circuit comprising:
    a light emitting diode;
    a photodetector for irradiation by the light emitting diode;
    a first amplifier coupled to the output of the photodetector;
    a second amplifier coupled to the output of the first amplifier;
    means coupling the first amplifier and the second amplifier for changing the input to the second amplifier with a waveform having a time constant greater than the fall time of the light emitting diode; and
    a clamping circuit coupled to the second amplifier limiting large currents from a power supply.

* * * * *